United States Patent
Yoshida et al.

(10) Patent No.: US 7,299,440 B2
(45) Date of Patent: Nov. 20, 2007

(54) SEMICONDUCTOR INTEGRATED CIRCUIT INCLUDING STANDARD CELL, STANDARD CELL LAYOUT DESIGN METHOD, AND LAYOUT DESIGN SOFTWARE PRODUCT STORED IN COMPUTER-READABLE RECORDING MEDIUM

(75) Inventors: Takeshi Yoshida, Kanagawa (JP); Naoyuki Tamura, Kanagawa (JP); You Yamamoto, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 156 days.

(21) Appl. No.: 10/980,171

(22) Filed: Nov. 4, 2004

(65) Prior Publication Data

US 2005/0198604 A1    Sep. 8, 2005

(30) Foreign Application Priority Data

Mar. 2, 2004    (JP)    ............................. 2004-057276

(51) Int. Cl.
    G06F 17/50    (2006.01)
(52) U.S. Cl. .......................................... 716/11; 716/14
(58) Field of Classification Search .................... 716/1, 716/8, 11, 14
    See application file for complete search history.

(56) References Cited

U.S. PATENT DOCUMENTS 5,798,541 A *  8/1998  Jassowski .................... 257/202
6,054,872 A    4/2000  Fudanuki et al.
2001/0049815 A1* 12/2001 Shinomiya et al. ........... 716/11

* cited by examiner

*Primary Examiner*—Thuan Do
(74) *Attorney, Agent, or Firm*—Oblon, Spivak, McClelland, Maier & Neustadt, P.C.

(57) ABSTRACT

According to the present invention, there is provided a semiconductor integrated circuit layout design method of laying out standard cells by using a layout apparatus including an input unit, an arithmetic unit, and a storage unit, comprising, causing the arithmetic unit to calculate an area necessary for layout of each standard cell by using data about a plurality of kinds of standard cells having different heights in a row direction, which is stored in the storage unit in advance, causing the arithmetic unit to calculate the numbers of stages of row regions having heights corresponding to the standard cells on the basis of the calculated area, and causing the arithmetic unit to lay out the standard cells in the corresponding row regions.

4 Claims, 10 Drawing Sheets

SEMICONDUCTOR INTEGRATED CIRCUIT INCLUDING STANDARD CELL, STANDARD CELL LAYOUT DESIGN METHOD, AND LAYOUT DESIGN SOFTWARE PRODUCT STORED IN COMPUTER-READABLE RECORDING MEDIUM

CROSS REFERENCE TO RELATED APPLICATION

This application is based upon and claims benefit of priority under 35 USC §119 from the Japanese Patent Application No. 2004-57276, filed on Mar. 2, 2004, the entire contents of which are incorporated herein by reference.

BACKGROUND OF THE INVENTION

The present invention relates to a semiconductor integrated circuit including a standard cell, a standard cell layout design method, and a layout design software product stored in a computer-readable recording medium.

In layout design of a semiconductor integrated circuit, a method of laying out standard cells having a predetermined height in the vertical direction (row direction) is employed.

FIG. 10 shows the structure of a typical standard cell. This standard cell has an inverter circuit structure including one p-channel transistor and one n-channel transistor. A gate electrode G, an n-well W1 in which a p-channel transistor is formed, and a p-well W2 in which an n-channel transistor is formed are laid out in correspondence with a planar structure formed on the surface portion of a semiconductor substrate. A space ha necessary in terms of design rules is present at the well boundary between the n-well W1 and the p-well W2.

When only logic is taken into consideration, the chip area can be reduced by making each standard cell small. Hence, the total area of a chip can be reduced by forming a standard cell having a small height.

In this case, however, the driving capability of one standard cell is low. To form a standard cell with a high driving capability, standard cells SC1 must be arrayed vertically in a plurality of stages, as shown in FIG. 11. As a circuit, inverters having identical structures are connected in parallel.

As described above, the space ha is necessary at the well boundary. This decreases the efficiency of the area usable as transistors. The more the standard cells stacked in the vertical direction, the larger the space ha becomes.

When a height h1 of the standard cell is set small, the height in the vertical direction can be suppressed small. However, the length in the horizontal direction must be increased. A cell having a small height and a large width is not preferable from the viewpoint of the degree of freedom in standard cell layout in a chip. Hence, there is a limitation on suppressing the height h1.

Conventionally, standard cells having one kind of vertical height (h1) are laid out. As shown in FIG. 12, one row region includes a structure having two stages of standard cells SC1 stacked vertically, a structure having one stage of standard cell SC1, and a structure having three stages of standard cells SC1. Hence, bent portions R1 and R2 form which connect a power supply voltage line Vcc and a ground voltage line Vss arranged on the upper and lower sides of the row region to the cells in different numbers of stages, resulting in a waste of area.

As described above, conventionally, standard cells having one kind of vertical height are stacked in a plurality of stages in accordance with the driving capability. Accordingly, the area efficiency decreases.

SUMMARY OF THE INVENTION

According to one aspect of the present invention, there is provided a semiconductor integrated circuit layout design method of laying out standard cells by using a layout apparatus including an input unit, an arithmetic unit, and a storage unit, comprising:

causing the arithmetic unit to calculate an area necessary for layout of each standard cell by using data about a plurality of kinds of standard cells having different heights in a row direction, which is stored in the storage unit in advance;

causing the arithmetic unit to calculate the numbers of stages of row regions having heights corresponding to the standard cells on the basis of the calculated area; and causing the arithmetic unit to lay out the standard cells in the corresponding row regions.

According to one aspect of the present invention, there is provided a semiconductor integrated circuit layout design method of laying out standard cells by using a layout apparatus including an input unit, an arithmetic unit, and a storage unit, comprising:

causing the input unit to input data about a plurality of kinds of standard cells having different heights in a row direction and storing the data in the storage unit;

causing the input unit to input data about a circuit structure of the semiconductor integrated circuit;

causing the arithmetic unit to calculate the necessary number of each of the plurality of kinds of standard cells on the basis of the data about the circuit structure;

causing the arithmetic unit to calculate an area necessary for layout of each standard cell;

causing the arithmetic unit to calculate the numbers of stages of row regions having heights corresponding to the standard cells on the basis of the calculated area;

causing the input unit to input network information of the semiconductor integrated circuit;

causing the arithmetic unit to connect the standard cells on the basis of the network information and optimize a position of each row region in consideration of a wiring length; and causing the arithmetic unit to lay out the standard cells in the corresponding row regions having the optimized position.

According to one aspect of the present invention, there is provided a layout design software product for a semiconductor integrated circuit using standard cells, which is stored in a computer-readable recording medium, comprising:

calculating an area necessary for layout of each standard cell by using data about a plurality of kinds of standard cells having different heights in a row direction;

calculating the numbers of stages of row regions having heights corresponding to the standard cells on the basis of the calculated area; and laying out the standard cells in the corresponding row regions.

According to one aspect of the present invention, there is provided a layout design software product for a semiconductor integrated circuit using standard cells, which is stored in a computer-readable recording medium, comprising:

inputting data about a plurality of kinds of standard cells having different heights in a row direction;

inputting data about a circuit structure of the semiconductor integrated circuit;

calculating the necessary number of each of the plurality of kinds of standard cells on the basis of the data about the circuit structure;

calculating an area necessary for layout of each standard cell;

calculating the numbers of stages of row regions having heights corresponding to the standard cells on the basis of the calculated area;

inputting network information of the semiconductor integrated circuit;

connecting the standard cells on the basis of the network information and optimizing a position of each row region in consideration of a wiring length; and laying out the standard cells in the corresponding row regions having the optimized position.

According to one aspect of the present invention, there is provided a layout design software product for a semiconductor integrated circuit using standard cells, which is stored in a computer-readable recording medium, the software causing a computer to function as a layout apparatus comprising:

an input unit which inputs data about a plurality of kinds of standard cells having different heights in a row direction, data about a circuit structure of the semiconductor integrated circuit, and network information of the semiconductor integrated circuit;

a storage unit which stores the input data; and an arithmetic unit which calculates the necessary number of each of the plurality of kinds of standard cells on the basis of the data about the circuit structure, calculates an area necessary for layout of each standard cell, calculates the numbers of stages of row regions having heights corresponding to the standard cells on the basis of the calculated area, connects the standard cells on the basis of the network information and optimizes a position of each row region in consideration of a wiring length and a speed of the circuit, and lays out the standard cells in the corresponding row regions having the optimized position.

According to one aspect of the present invention, there is provided a semiconductor integrated circuit wherein a plurality of kinds of standard cells having the same function, different heights in a row direction, and different driving capabilities in accordance with the height are laid out in a plurality of kinds of row regions each of which is prepared in correspondence with the row-direction height of a corresponding one of the plurality of kinds of standard cells.

DETAILED DESCRIPTION OF THE EMBODIMENTS

A semiconductor integrated circuit including a standard cell, a standard cell layout design method, and a layout design software product stored in a computer-readable recording medium according to the embodiment of the present invention will be described below.

In this embodiment, a plurality of kinds of standard cells having different vertical heights are prepared in accordance with the driving capability required for a circuit.

Figure 1:
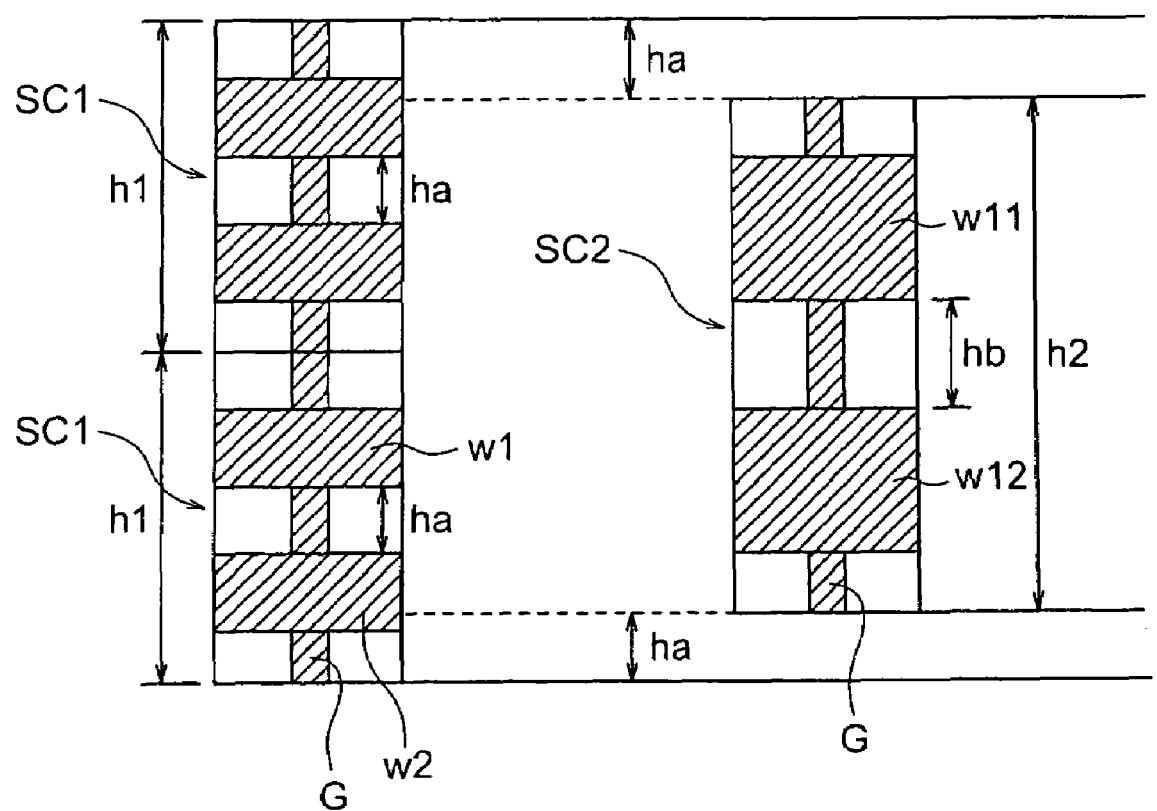
FIG. 1 is an explanatory view showing an example of a standard cell used in an integrated circuit layout design method according to the embodiment of the present invention.

As shown in FIG. 1, in addition to a standard cell SC1 having a smallest height h1 and a lowest driving capability, a standard cell SC2 having a driving capability, e.g., twice that of the standard cell SC1 is prepared. The standard cells SC1 and SC2 have the same horizontal size.

As described above, the standard cell SC1 has a gate electrode G, p-well W1 and n-well W2. A space ha is present at the well boundary.

On the other hand, the standard cell SC2 has the gate electrode G, p-well W11, and n-well W12. A space hb is present at the well boundary.

Figure 2:
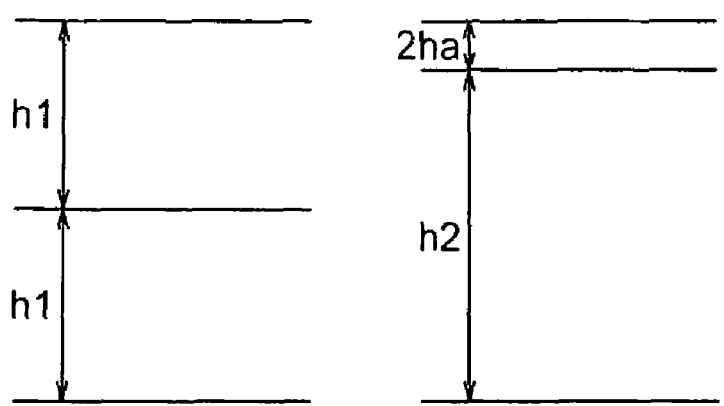
FIG. 2 is an explanatory view showing the relationship in vertical height between a plurality of kinds of standard cells used in the layout design method.

The vertical height of the structure including one stage of standard cell SC2 is smaller by 2×ha than in the structure including two stages of standard cells SC1 stacked vertically. Hence, as shown in FIG. 2, the height of the two stages of standard cells SC1 and that of one stage of standard cell SC2 have a relationship given by $$h2 = 2 \times h1 - 2 \times ha \quad (1)$$

Figure 3:
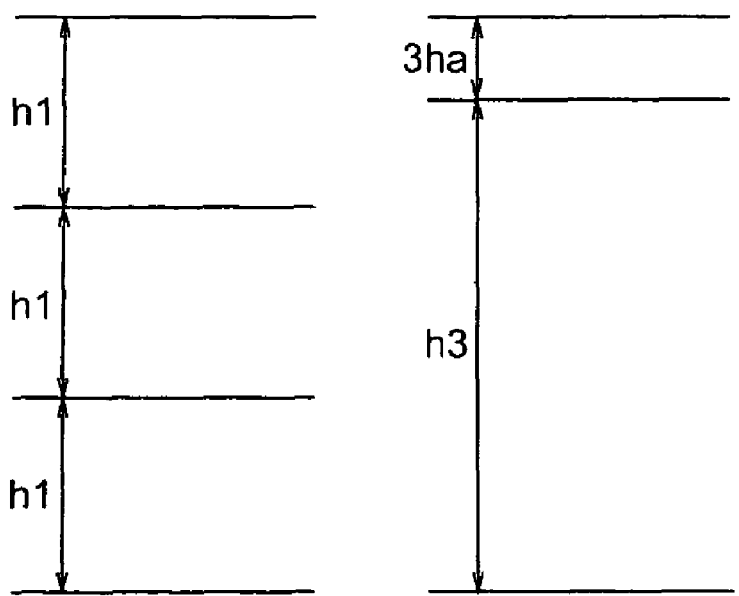
FIG. 3 is an explanatory view showing the relationship in vertical height between a plurality of kinds of standard cells used in the layout design method.

A standard cell SC3 having a driving capability three times that of the standard cell SC1 is prepared. As shown in FIG. 3, a height 3×ha of a structure including three stages of standard cells SC1 stacked vertically and the height of one stage of standard cell SC3 have a relationship given by $$h3 = 3 \times h1 - 3 \times ha \quad (2)$$

Figure 4:
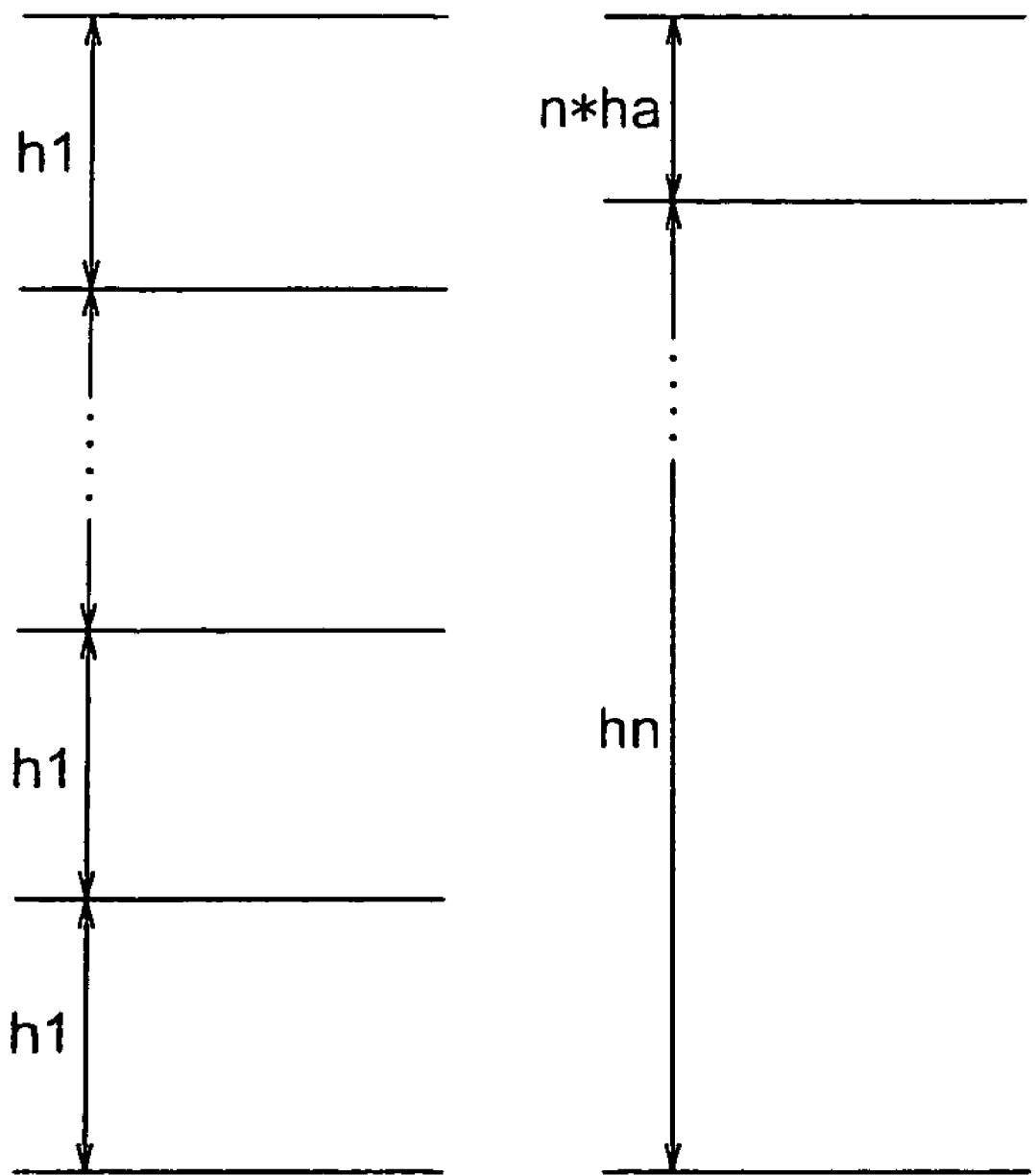
FIG. 4 is an explanatory view showing the relationship in vertical height between a plurality of kinds of standard cells used in the layout design method.

Consider a case in which a standard cell SCn having a driving capability n-times (n is an integer; n≧2) that of the standard cell SC1 is prepared. As shown in FIG. 4, a height n×ha of a structure including n stages of standard cells SC1 stacked vertically and the height of one stage of standard cell SCn have a relationship given by $$hn = n \times h1 - n \times ha \quad (3)$$

The plurality of kinds of standard cells SC1 to SCn having different vertical heights are prepared and selectively used in accordance with the driving capability. Accordingly, as compared to a structure including one kind of standard cells having the height h1 stacked vertically, the vertical height and the chip area can be reduced while ensuring the same driving capability.

Row regions RSC1 to RSCn having heights corresponding to the vertical heights h1, h2, h3, . . . , hn of the standard cells SC1 to SCn are prepared for the respective standard cells. When the standard cell SC1 is allocated to the row region RSC1, the standard cell SC2 is allocated to the row region RSC2, and the standard cell SC3 is allocated to the row region RSC3, the total area of the chip can further be reduced.

Figure 5:
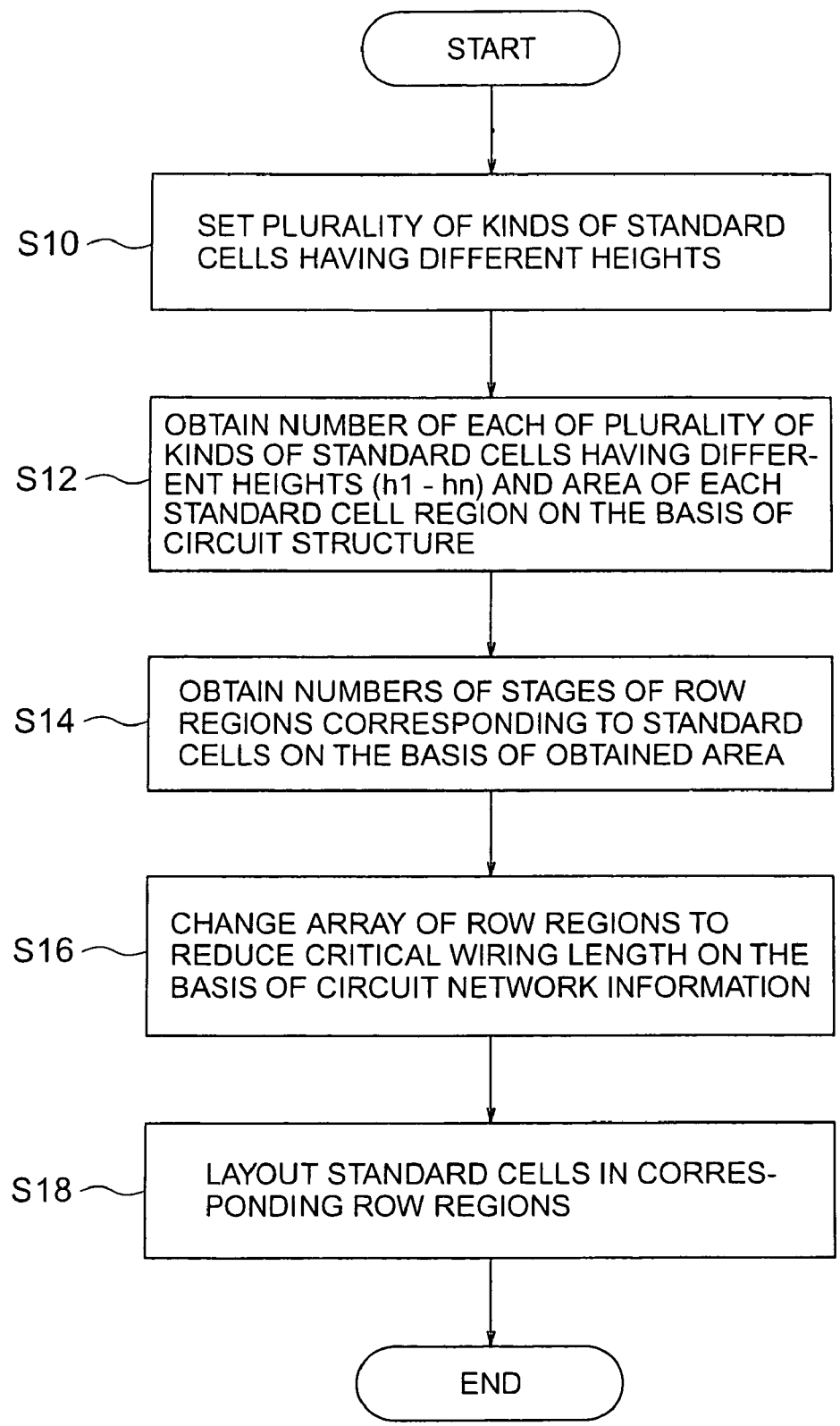
FIG. 5 is a flowchart showing the procedures of processing in the layout design method.

FIG. 5 is a flowchart showing the procedures of a standard cell layout design method according to this embodiment.

Figure 6:
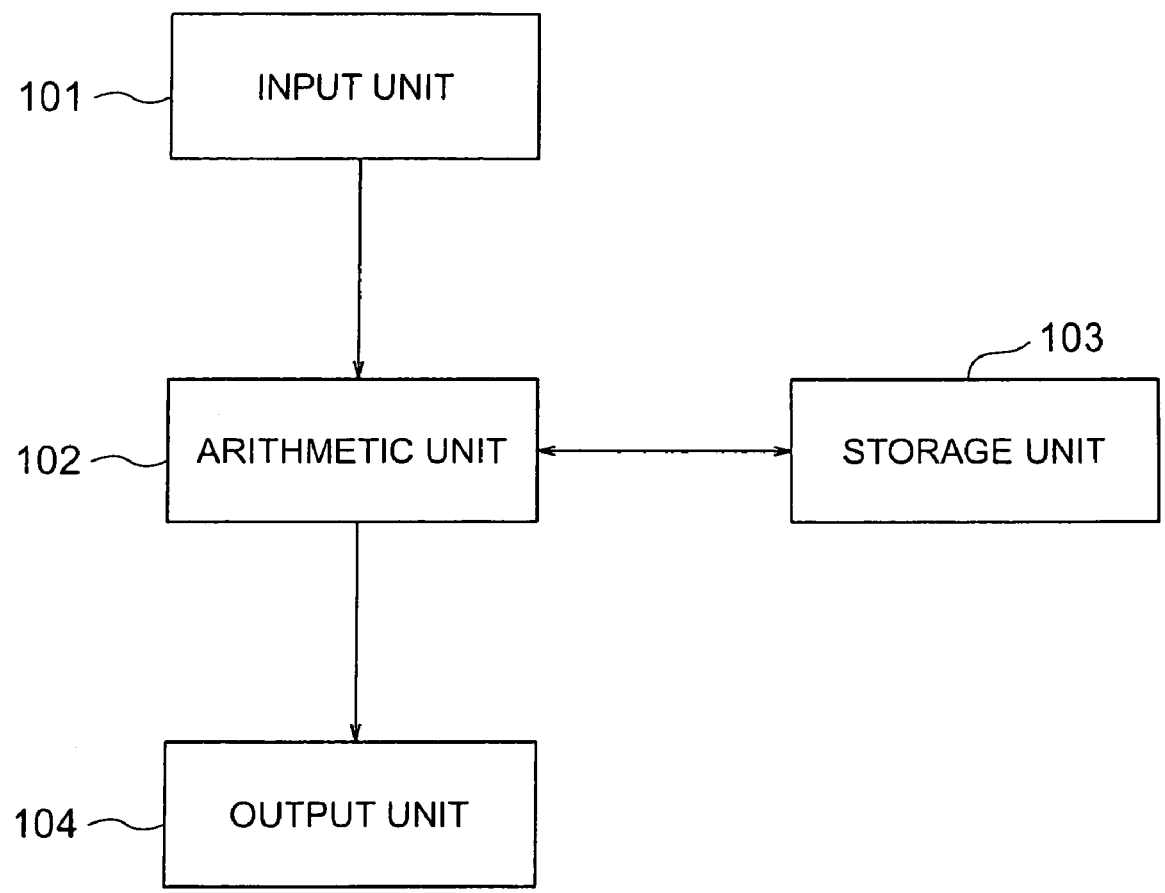
FIG. 6 is a block diagram showing the arrangement of an integrated circuit layout apparatus which is implemented by causing a computer to execute the layout design software according to the embodiment.

This layout design method can be stored in a computer-readable recording medium (e.g., a CD-ROM, an MO disk, or a floppy disk) as software which causes a computer to execute the layout design. When a computer is caused to load this program and execute the layout design, a layout apparatus having an arrangement shown in FIG. 6 can be implemented.

This apparatus comprises an input unit 101 which inputs data given by an operator, an arithmetic unit 102 which executes processing to be described later by using the input data and data stored in a storage unit 103 in advance, the storage unit 103 which stores the arithmetic result or the data input from the input unit 101, and an output unit 104 which outputs the arithmetic result or the data stored in the storage unit 103 as needed.

In step S10 in the flow chart of FIG. 5, data about the plurality of kinds of standard cells SC1 to SCn having different heights, and for example, data such as the vertical sizes h1 to hn and driving capabilities of the standard cells SC1 to SCn are input to the input unit 101 and stored in the storage unit 103.

In step S12, data about the circuit structure of an integrated circuit is input to the input unit 101. The arithmetic unit 102 calculates the number of each of the plurality of kinds of standard cells SC1 to SCn on the basis of the driving capability required the circuit structure. The arithmetic unit 102 also calculates the area necessary for each of the standard cells SC1 to SCn. For example, when the area necessary for laying out one standard cell SC1 is A (A>0), and M (M is an integer; M≧1) standard cells SC1 are required, an area A1×M1 is necessary.

In step S14, on the basis of the area obtained for each of the standard cells SC1 to SCn, the arithmetic unit 102 calculates the numbers of stages of row regions RSC1 to RSCn. For example, the total area necessary for laying out the standard cells SC1 is A1×M1, and the area of one stage of the row region RSC1 for the standard cells SC1 is R1, the number of stages is determined from A1×M1/R1 (the fractional portion is rounded up).

Figure 7:
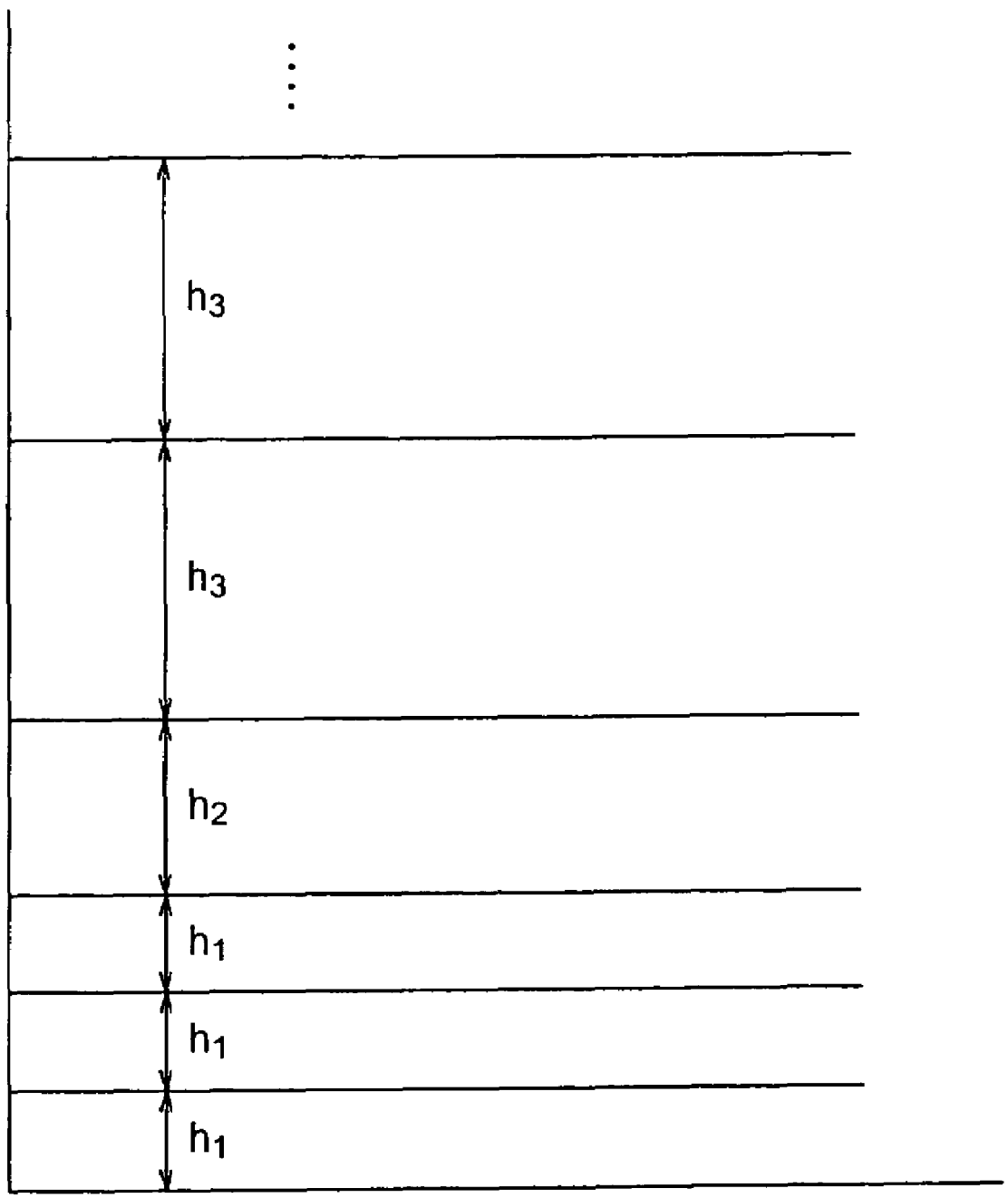
FIG. 7 is an explanatory view showing a state in which row regions are stacked vertically in the layout design method.

For example, assume that three stages of row regions RSC1, one stage of row region RSC2, and two stages of row regions RSC3 are necessary. First, as shown in FIG. 7, the row regions are arrayed in the vertical direction sequentially from, e.g., the lower side.

In step S16, circuit network information is input to the input unit 101. The arithmetic unit 102 obtains the wiring length when the standard cells SC1 to SCn are laid out in the arrayed state of the row regions RSC1 to RSC3 shown in FIG. 7.

Figure 8:
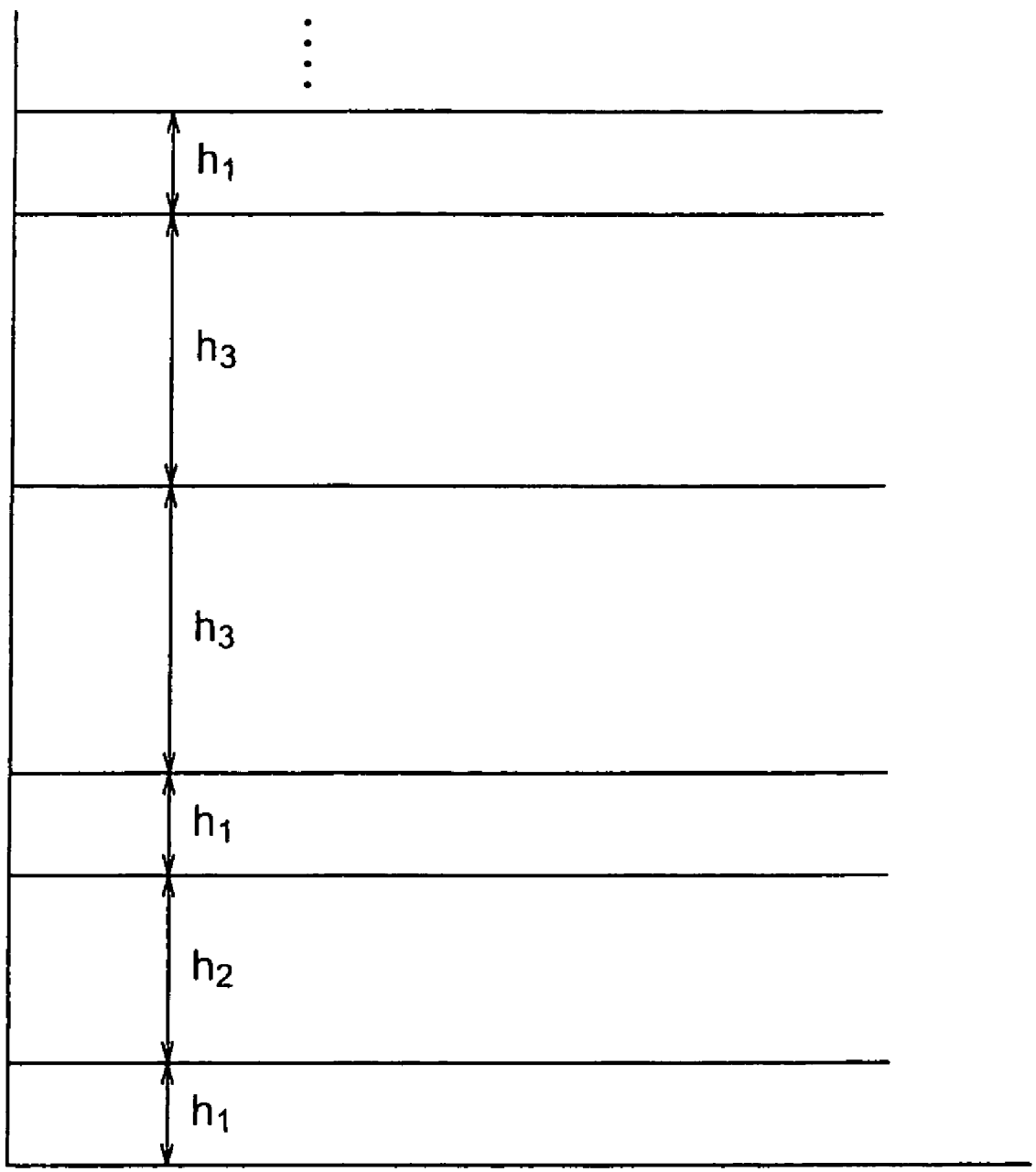
FIG. 8 is an explanatory view showing a state in which the array of row regions shown in FIG. 7 is changed to reduce the wiring length.

The array of the row regions RSC1 to RSC3 is changed such that the critical wiring length that decides the operation of the entire integrated circuit. That is, the structure is optimized such that the integrated circuit can obtain a desired operation speed. For example, the arrayed state of the row regions RSC1 to RSC3 shown in FIG. 7 is changed by arraying, vertically from the lower side, one stage of row region RSC1, one stage of row region RSC2, one stage of row region RSC1, two stages of row regions RSC3, and one stage of row region RSC1, as shown in FIG. 8.

In step S18, the arithmetic unit 102 lays out the standard cells SC1 to SC3 respectively in the row regions RSC1 to RSC3 having the optimized array. After that, the output unit 104 outputs the arithmetic result.

Figure 9:
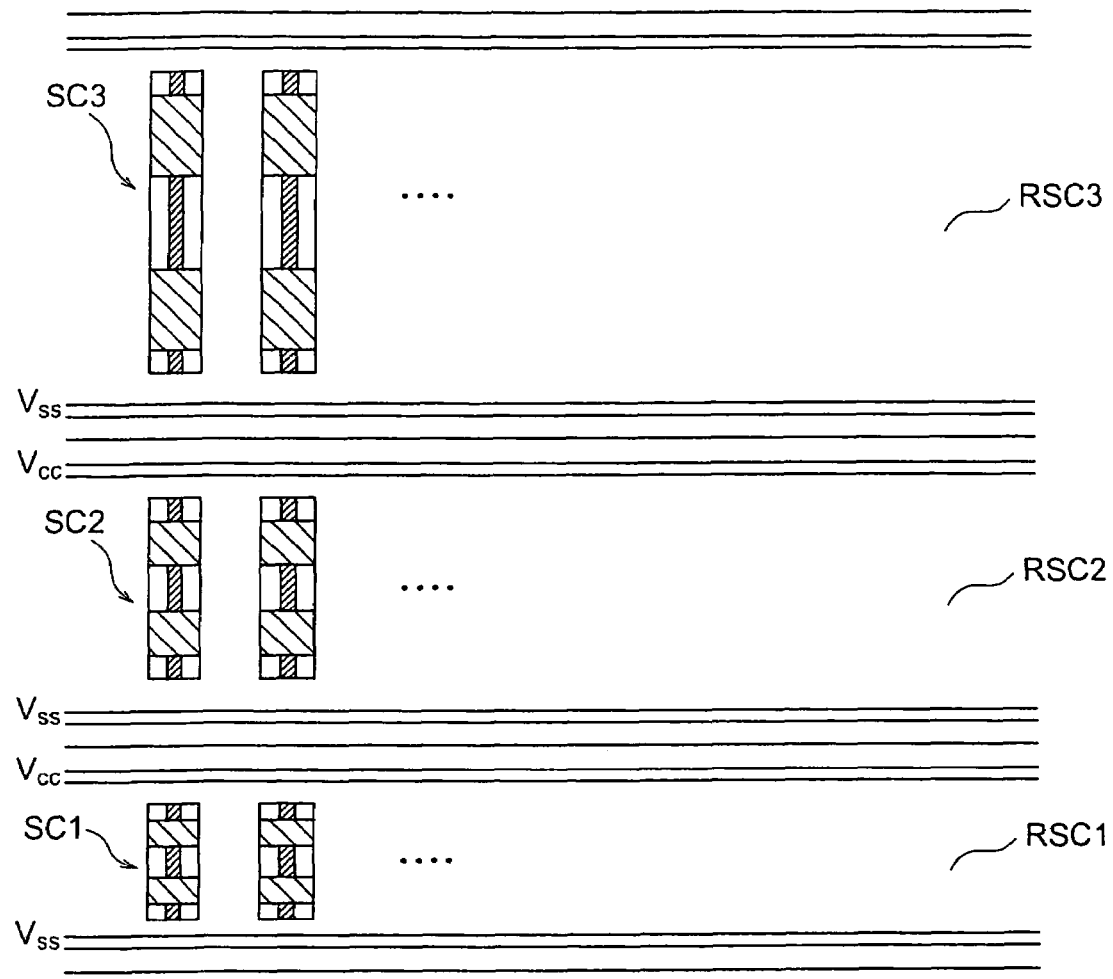
FIG. 9 is an explanatory view showing a state in which standard cells are laid out in each row region by the layout design method according to the embodiment.
Figure 10:
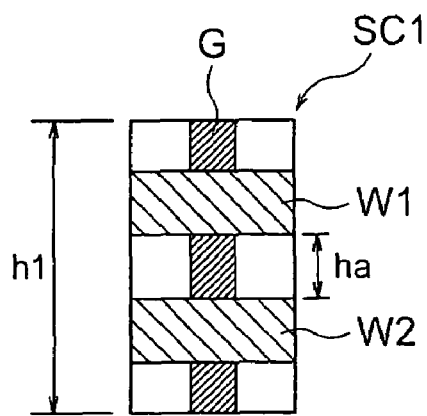
FIG. 10 is an explanatory view showing the structure of a conventional standard cell.
Figure 11:
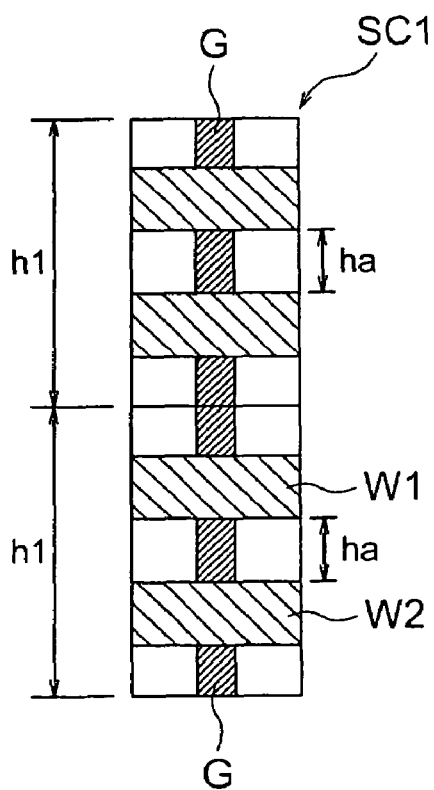
FIG. 11 is an explanatory view showing a state in which the standard cells are stacked vertically.
Figure 12:
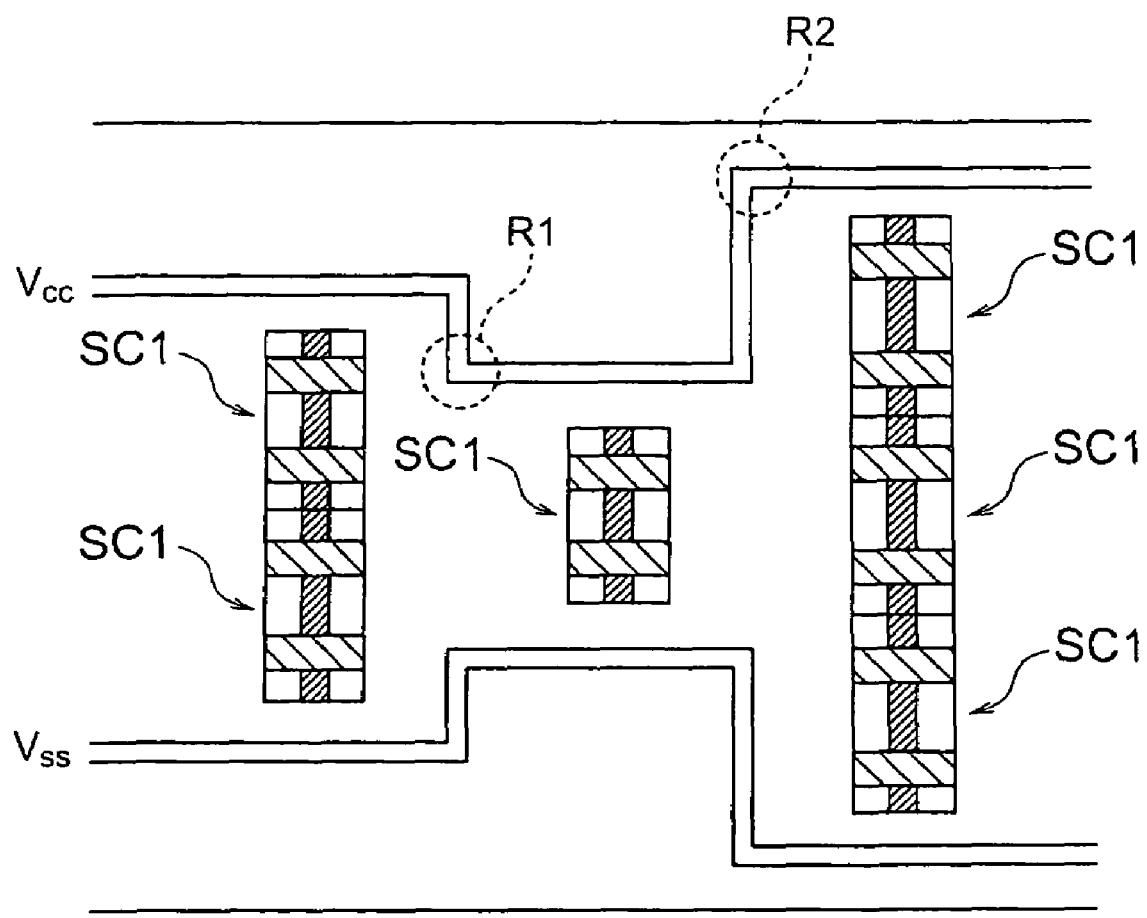
FIG. 12 is an explanatory view showing the shape of a power supply line and ground line in a conventional semiconductor integrated circuit.

When the standard cells SC1 to SCn are respectively laid out in the row regions RSC1 to RSCn, as shown in FIG. 9, power supply voltage lines Vcc and ground voltage lines Vss can linearly be arranged. The bent portions R1 and R2 which are conventionally formed as described with reference to FIG. 12 can be eliminated, and the area efficiency can be increased.

According to this embodiment, the plurality of kinds of standard cells SC1 to SCn having different heights are set in advance. The standard cells are laid out in the dedicated row regions RSC1 to RSCn in accordance with the necessary driving capability. Accordingly, the chip area can be reduced as compared to the conventional structure in which one kind of standard cells SC are stacked vertically.

The above-described embodiment is merely an example, and the present invention is not limited to this. For example, the standard cell need not always have an inverter circuit structure and can have an arbitrary circuit structure.

The invention claimed is:

1. A semiconductor integrated circuit layout design method of laying out standard cells by using a layout apparatus including an input unit, an arithmetic unit, and a storage unit, comprising:

causing the arithmetic unit to calculate an area necessary for layout of each standard cell by using data about a plurality of kinds of standard cells having different heights in a row direction, which is stored in the storage unit in advance;

causing the arithmetic unit to calculate the numbers of stages of row regions having heights corresponding to the standard cells on the basis of the calculated area; and causing the arithmetic unit to lay out the standard cells in the corresponding row regions.

2. A method according to claim 1, wherein the plurality of kinds of standard cells having different heights in the row direction have the same function and different driving capabilities in correspondence with the height.

3. A computer-readable medium storing a layout design software product for a semiconductor integrated circuit using standard cells, for use in a layout apparatus including an input unit, an arithmetic unit, and a storage unit, said layout design software product when executed by a computer resulting in performance of steps comprising:

causing the arithmetic unit to calculate an area necessary for layout of each standard cell by using data about a plurality of kinds of standard cells having different heights in a row direction;

calculating the numbers of stages of row regions having heights corresponding to the standard cells on the basis of the calculated area; and laying out the standard cells in the corresponding row regions.

4. A method according to claim 3 wherein the plurality of kinds of standard cells having different heights in the row direction have the same function and different driving capabilities in correspondence with the height.

* * * * *